United States Patent
Conraux et al.

(10) Patent No.: US 10,326,421 B2
(45) Date of Patent: Jun. 18, 2019

(54) MAGNETORESISTIVE-BASED SIGNAL SHAPING CIRCUIT FOR AUDIO APPLICATIONS

(71) Applicant: Crocus Technology SA, Grenoble (FR)

(72) Inventors: Yann Conraux, Sassenage (FR); Quentin Stainer, Montbonnot-St-Martin (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 16/084,637

(22) PCT Filed: Mar. 15, 2017

(86) PCT No.: PCT/IB2017/051479
§ 371 (c)(1),
(2) Date: Sep. 13, 2018

(87) PCT Pub. No.: WO2017/158517
PCT Pub. Date: Sep. 21, 2017

(65) Prior Publication Data
US 2019/0081602 A1 Mar. 14, 2019

(30) Foreign Application Priority Data
Mar. 16, 2016 (EP) .................................... 16290048

(51) Int. Cl.
*H03F 15/00* (2006.01)
*H01L 43/08* (2006.01)
(Continued)

(52) U.S. Cl.
CPC ............ *H03F 15/00* (2013.01); *H01L 43/08* (2013.01); *H03G 7/004* (2013.01); *H04R 3/00* (2013.01)

(58) Field of Classification Search
None
See application file for complete search history.

(56) References Cited

U.S. PATENT DOCUMENTS

| 3,215,928 A | 11/1965 | Aiken |
| 3,388,217 A | 6/1968 | Aiken |

(Continued)

FOREIGN PATENT DOCUMENTS

| CN | 103414176 A | 11/2013 |
| EP | 0678925 A1 | 10/1995 |

(Continued)

OTHER PUBLICATIONS

International Search Report for PCT/IB2017/051479 dated May 22, 2017.
Written Opinion for PCT/IB2017/051479 dated May 22, 2017.

*Primary Examiner* — Paul W Huber
(74) *Attorney, Agent, or Firm* — Pearne & Gordon LLP

(57) ABSTRACT

A magnetoresistive-based signal shaping circuit for audio applications includes: a field emitting device configured for receiving an input current signal from an audio signal source and for generating a magnetic field in accordance with the input current signal, and a first magnetoresistive element having a first electrical resistance and electrically connected in series to a second magnetoresistive element having a second electrical resistance. The magnetoresistive-based signal shaping device provides an output signal across the second magnetoresistive element when an input voltage is applied across the first and second magnetoresistive element in series. The output signal is a function of the electrical resistance and yields a dynamic range compression effect. The first and second electrical resistance vary with the magnetic field in an opposite fashion.

16 Claims, 5 Drawing Sheets

(51) Int. Cl.
*H03G 7/00* (2006.01)
*H04R 3/00* (2006.01)

(56) References Cited

U.S. PATENT DOCUMENTS

| | | |
|---|---|---|
| 5,724,434 A | 3/1998 | Myers |
| 2008/0272448 A1 | 11/2008 | Dahmani |

FOREIGN PATENT DOCUMENTS

| | | |
|---|---|---|
| EP | 2818884 A1 | 12/2014 |
| EP | 3029792 A1 | 6/2016 |
| WO | 2011038343 A1 | 3/2011 |

MAGNETORESISTIVE-BASED SIGNAL SHAPING CIRCUIT FOR AUDIO APPLICATIONS

FIELD

The present invention concerns a magnetoresistive-based signal shaping circuit for audio applications.

DESCRIPTION OF RELATED ART

Despite having multiple drawbacks, vacuum tubes are very commonly employed for signal amplification in high-end audio applications. When an input signal of a vacuum tube exceeds a threshold value, the vacuum tube becomes overdriven, resulting in a progressive decrease of the output gain above this threshold value. This will induce a non-linear saturation of the output voltage called "soft clipping". Such a saturation is desirable in applications were a significant distortion of the input signal is sought after, for instance in high-gain instrument amplifiers. Most notably, "soft clipping" introduce low-power/low order harmonics that are considered to produce a richer sound.

On the other hand, solid state amplifiers, relying on transistor technology, do not display a smooth "soft clipping" saturation. Instead, as the input threshold value is exceeded, the solid state amplifier output is abruptly chopped off, resulting in a "hard clipping" saturation. This hard clipping behavior introduces high-power/high-order harmonics to the original signal that are considered harsh and unpleasant to the ear (due to psychoacoustic phenomena).

Emulation of this soft-clipping using solid state technology may be achieved, but usually requires complex topologies or the usage of expensive Digital Signal Processors (DSP).

As a result, vacuum tubes remains widely used despite having a multitude of drawback and weaknesses. Indeed, vacuum tubes require large operating voltage to properly function, typically above 300 V. These voltages require power transformers that are both expensive and heavy. Large capacitors are also requires in the power supplies which can expose users to potentially lethal voltage discharges. Proper functioning requires heating of the tube typically in the 200-300° C. range. This heating implies constant current consumption, warmup and cooldown time of several minutes and design of specific power supplies for the heater. Furthermore, this heat requires proper chassis venting and can be responsible for premature aging of adjacent components. The high impedance of vacuum tubes requires a matching output transformer for low impedance loads like audio speakers. Vacuum tubes are fragile and become easily damaged during handling, especially when hot. Vacuum tubes also rely on thermionic emission to operate, implying that the cathode electron-emitting materials are used up during operation. As a result, vacuum tube lifetime is limited and unpredictable.

Moreover, vacuum tubes must be encased in a glass-bulb, which can promote parasitic microphonic behaviors. Vacuum tubes are bulky, which in combination with the high voltage/high temperature they requires makes them unsuitable for portable, energy-efficient applications. Their manufacturing requires a substantial proportion of hand work, resulting in a large variability of their characteristics and expensive production costs (typically several dollars per unit). Furthermore, vacuum tubes require a break-in period before their optimum performances can be reached.

SUMMARY

The present disclosure concerns a magnetoresistive-based signal shaping circuit for audio applications comprising: a field emitting device configured for receiving an input current signal from an audio signal source and for generating a magnetic field in accordance with the input current signal, a first magnetoresistive element electrically connected in series to a second magnetoresistive element, the first magnetoresistive element comprising at least one magnetoresistive cell having a first electrical resistance and the second magnetoresistive element comprising at least one magnetoresistive cell having a second electrical resistance, both first and second electrical resistance varying with the magnetic field; the magnetoresistive-based signal shaping device providing an output signal across the second magnetoresistive element when an input voltage is applied across the first and second magnetoresistive element in series; the output signal being a function of the electrical resistance and yielding a dynamic range compression effect; wherein the magnetoresistive cell comprises magnetic tunnel junction; and wherein the first electrical resistance and the second electrical resistance varies with the magnetic field in an opposite fashion.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
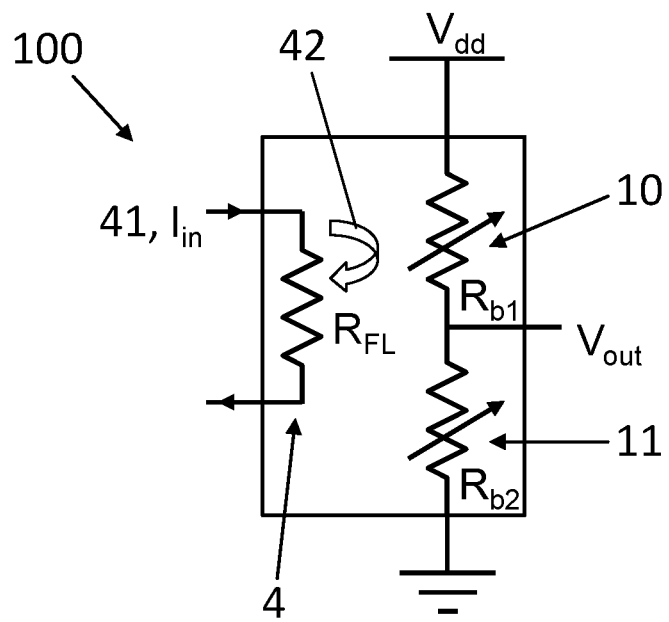
FIG. 1 represents a magnetoresistive-based signal shaping circuit for audio application, according to an embodiment.

FIG. 1 represents a magnetoresistive-based signal shaping circuit 100 for audio application, according to an embodiment. The signal shaping circuit 100, configured as a voltage divider, comprises a first magnetoresistive element 10 electrically connected in series to a second magnetoresistive element 11. The first magnetoresistive element 10 comprises an assembly of magnetoresistive cell 1 having a first electrical resistance $R_{b1}$ that varies with the magnetic field 42 and the second magnetoresistive element 11 comprises an assembly magnetoresistive cell 1 having a second electrical resistance $R_{b2}$ that varies with the magnetic field 42. An output voltage $V_{out}$ across the second magnetoresistive element 11 varies with the magnetic field when a bias voltage $V_{dd}$ is applied across the first and second magnetoresistive element 10, 11 in series.

The signal shaping circuit 100 further comprises a field device 4 configured for receiving an input current 41 from an audio signal source (not represented in FIG. 1) and for generating a magnetic field 42 in accordance with the input current 41.

In the example of FIG. 1, the field device is represented as a field line 4 having a field resistance $R_{FL}$ configured for passing the input current 41 that generates the magnetic field 42. Alternatively, the field device 4 can comprise an external coil (not represented) generating the magnetic field globally across the whole signal shaping circuit 100 when the input current 41 is passed in the coil.

Figure 2:
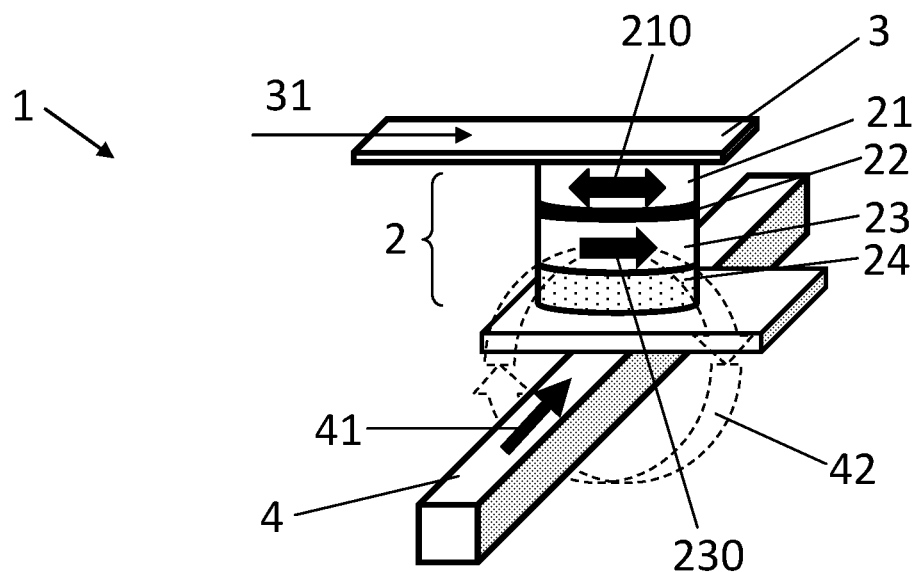
FIG. 2 shows a magnetoresistive cell comprising a self-referenced MRAM cell, according to an embodiment.
Figure 3:
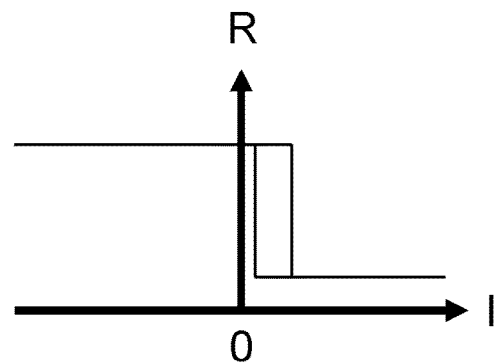
FIG. 3 shows a hysteresis loop for the magnetoresistive cell comprising a MRAM element.

In an embodiment, the magnetoresistive cell comprises a self-referenced MRAM cell 1. An example of a MRAM cell 1 is shown in FIG. 2. In this particular example, the magnetoresistive cell 1 comprises a magnetic tunnel junction 2 including a sense layer 21 having a freely alignable sense magnetization 210; a reference layer 23 having a pinned storage magnetization 230, and a separating layer 22 comprised between the sense layer 21 and the reference layer 23. At normal operating temperature of the signal shaping device 100 (typically below 150° C.), the sense magnetization 210 is aligned along the magnetic field 42 generated by the field device 4 while the orientation of the reference magnetization 230 remains unchanged. The electrical resistance $R_{b1}$, $R_{b2}$ of the magnetoresistive cell 1 thus varies in accordance with the change in the relative alignment of the sense magnetization 210 with respect to the one of the reference magnetization 230. FIG. 3 shows a hysteresis loop, or magnetization curve, for a MRAM element 1 wherein change in the resistance R of the MRAM element 1 is plotted as a function of the input current I, and thus the magnetic field 42.

The sense layer 21 and the storage layer 23 can include, or can be formed of, a magnetic material and, in particular, a magnetic material of the ferromagnetic type. A ferromagnetic material can be characterized by a magnetization with a particular coercivity, which is indicative of a magnitude of a magnetic field to reverse the magnetization after it is driven to saturation in one direction. In general, the sense layer 21 and the storage layer 23 can include the same ferromagnetic material or different ferromagnetic materials. The sense layer 21 can include a soft ferromagnetic material, namely one having a relatively low coercivity, while the storage layer 23 can include a hard ferromagnetic material, namely one having a relatively high coercivity. In such manner, a magnetization of the sense layer 21 can be readily varied under low-intensity magnetic fields 42 generated in response to the input current 41 while the storage magnetization 230 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni 8oFe 2o); alloys based on Ni, Fe, and boron ("B"); CoFe; and alloys based on Co, Fe, and B. In some instances, alloys based on Ni and Fe (and optionally B) can have a smaller coercivity than alloys based on Co and Fe (and optionally B). A thickness of each of the sense layer 21 and the storage layer 23 can be in the nm range, such as from about 1 nm to about 20 nm. Other implementations of the sense layer 21 and the storage layer 23 are contemplated. For example, either, or both, of the sense layer 21 and the storage layer 23 can include multiple sub-layers in a fashion similar to that of the so-called synthetic antiferromagnetic layer. Alternatively, the storage layer 23 can include a synthetic ferrimagnet structure. The latter structure has improved stability and reduces the magnetostatic coupling between the storage layer 23 and the sense layer 21.

In an embodiment, the separating layer 22 is a tunnel barrier layer that can include, or can be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 10 nm.

The magnetic tunnel junction 2 can further include a pinning layer 24, which is disposed adjacent to the storage layer 23 and, through exchange bias, stabilizes the storage magnetization 230 along a particular direction when a temperature within, or in the vicinity of, the pinning layer 24 is at a low threshold temperature $T_L$. The pinning layer 24 unpins, or decouples, the storage magnetization 230 when the temperature is at a high threshold temperature $T_H$, thereby allowing the storage magnetization 230 to be switched to another direction.

The pinning layer 24 can include, or can be formed of, a magnetic material and, in particular, a magnetic material of the antiferromagnetic type. Suitable antiferromagnetic materials include transition metals and their alloys. For example, suitable antiferromagnetic materials include alloys based on manganese (Mn), such as alloys based on iridium (Ir) and Mn (e.g., IrMn); alloys based on Fe and Mn (e.g., FeMn); alloys based on platinum (Pt) and Mn (e.g., PtMn); and alloys based on Ni and Mn (e.g., NiMn). Preferably, antiferromagnetic materials include a high temperature antiferromagnet such as alloys based on Pt and Mn (or based on Ni and Mn), such that the high threshold temperature $T_H$ can be in the range of about 200° C. to about 400° C., i.e., well above normal operating temperature of the signal shaping device 100. In that case, the storage magnetization 230 can remain pinned during the lifetime of the product.

In a variant, the separating layer 22 includes, or can be formed of, a metal such as copper. In this configuration, the magnetoresistive effect of the magnetoresistive element 1 is based on the giant magnetoresistance.

In another variant (not represented), the separating layer 22 includes, or can be formed of, a ferromagnetic metal or alloy, such as a NiFe alloy, that provides an anisotropic magnetoresistance effect.

In an embodiment, the first resistance $R_{b1}$ of the first magnetoresistive element 10 varies in an opposite fashion to the second resistance $R_{b2}$ of the second magnetoresistive element 11.

In the case the magnetoresistive cell 1 comprises a MRAM cell as described above, the storage magnetization 230 of the magnetoresistive cell 1 comprised in the first magnetoresistive element 10 can be oriented in a direction opposed to the direction of the storage magnetization 230 of the magnetoresistive cell 1 comprised in the second magnetoresistive element 11. Orienting the storage magnetization 230 can be performed during a programming operation by heating the magnetic tunnel junction 2 at the high threshold temperature $T_H$ and aligning the storage magnetization 230, for example in a magnetic field of by passing a spin polarized current in the magnetic tunnel junction 2.

Due to the opposite orientation of the storage magnetization 230 in the magnetoresistive cell 1 in the first and second magnetoresistive element 10, 11, the first resistance $R_{b1}$ of the first magnetoresistive element 10 varies in an opposite fashion to the second resistance $R_{b2}$ of the second magnetoresistive element 11 in response to a same magnetic field. For example, the first resistance $R_{b1}$ decreases while the second resistance $R_{b2}$ increases, leading to a shift of the output voltage $V_{out}$ according to the input current 41.

Figure 4:
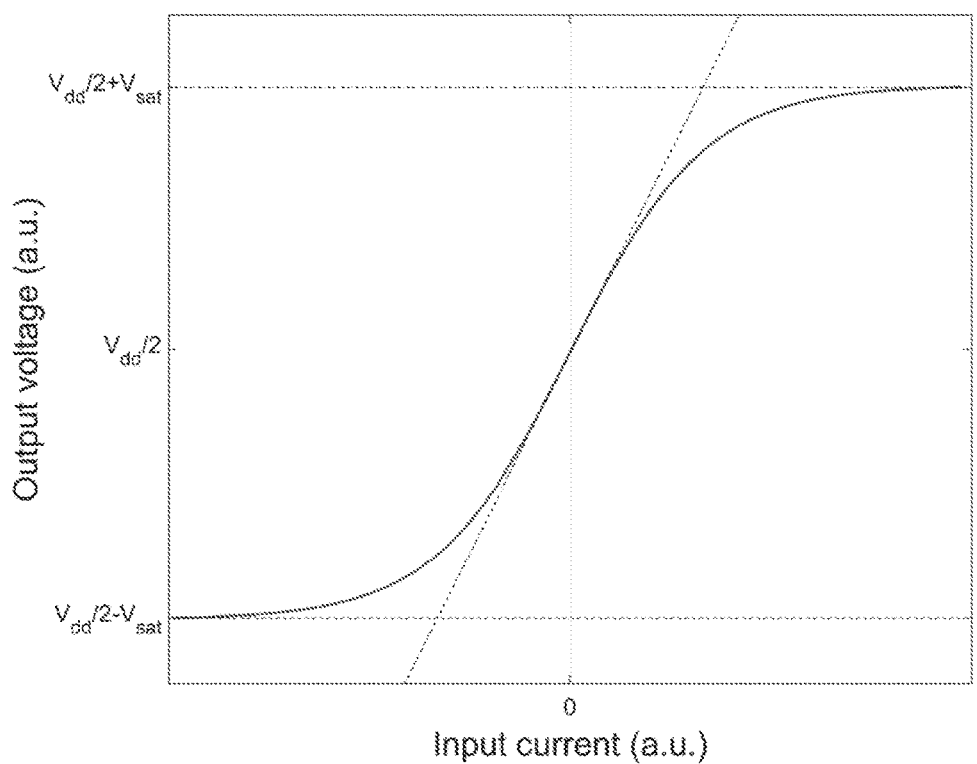
FIG. 4 shows a graph of the output voltage as a function of the input current.

FIG. 4 shows a graph of the output voltage $V_{out}$ as a function of the input current 41. As the input current 41 is increased, the sense magnetization 210 of the magnetoresistive cell 1 becomes progressively saturated in the generated magnetic field 42. Depending on the orientation of the storage magnetization 230, the resistance $R_{b1}$ and $R_{b2}$ reaches a low or high value. The MRAM cell 1 become progressively saturated in the direction of the magnetic field 42, leading to a progressive saturation of the resistances $R_{b1}$ and $R_{b2}$ of the first and second magnetoresistive element 10, 11, to a low or to a high value. As a result, the output voltage $V_{out}$ progressively saturates to a low value ($V_{dd}/2-V_{sat}$) or a high value ($V_{dd}/2+V_{sat}$), where $V_{sat}$ is a saturation voltage of the magnetoresistive cell 1. This behavior of the output voltage $V_{out}$ yields a dynamic range compression effect that corresponds to a "soft clipping" behavior, characteristic of vacuum tube amplification.

Figure 5:
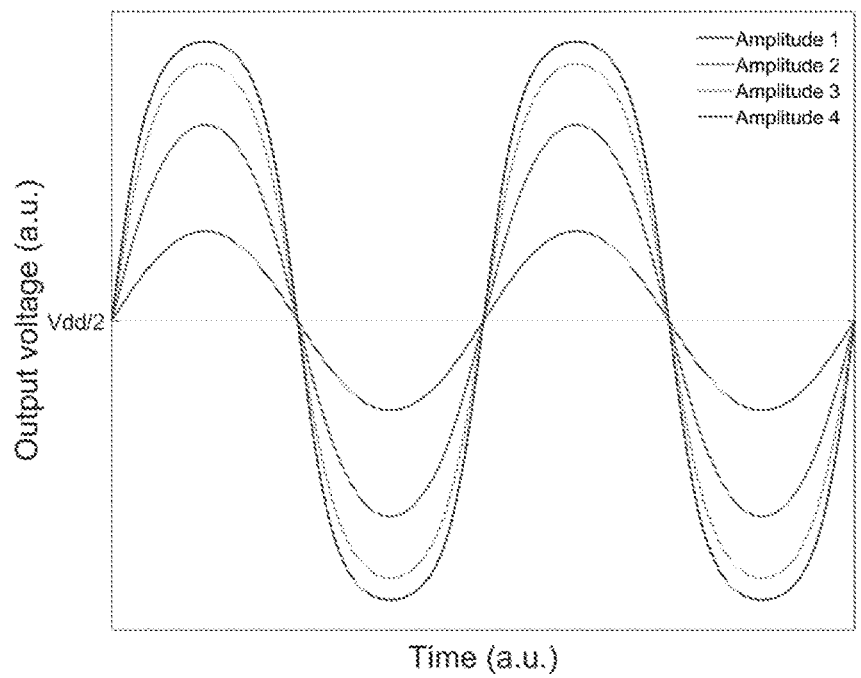
FIG. 5 shows a graph of the output voltage of the signal shaping device as a function of a sinusoidal input current, according to an embodiment.

FIG. 5 shows a graph of the output voltage $V_{out}$ of the signal shaping device 100 as a function of a sinusoidal input current 41 having four different, increasing amplitude values. The dynamic range compression effect of the signal shaping device 100 results in the output voltage $V_{out}$ being smooth for all amplitude values of the input current 41, even when the saturation regime is reached. Here, the term smooth means that the output voltage $V_{out}$ can be represented by a smooth function having no discontinuity or beak.

Figure 6:
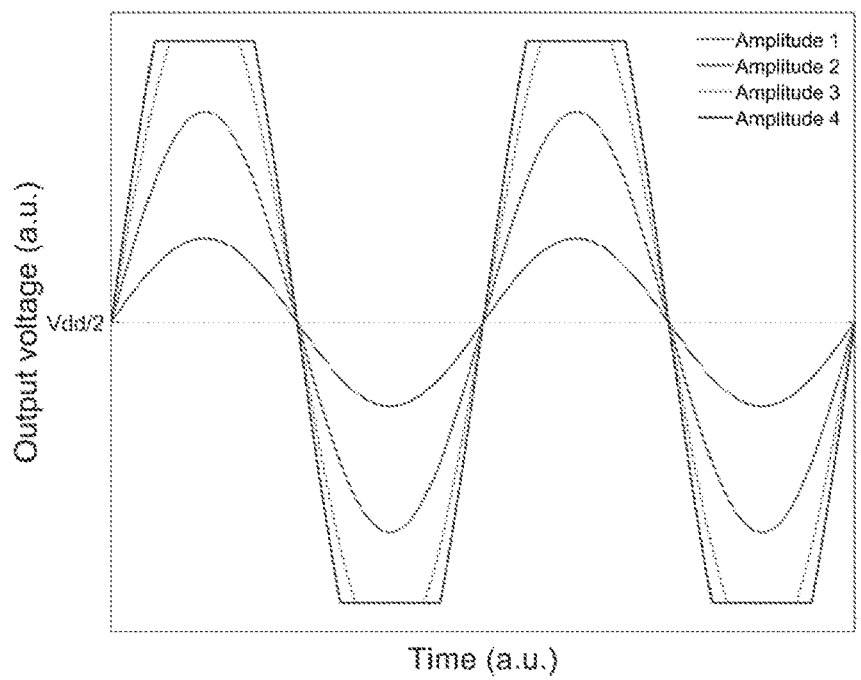
FIG. 6 shows a graph of the output voltage of a solid state linear amplifier.

FIG. 6 shows a graph of the output voltage of a solid state linear amplifier with similar saturation threshold and gain as the ones of the signal shaping device 100, as a function of a sinusoidal input current having four different, increasing amplitude values. The output voltage of the solid state amplifier is abruptly chopped off as the amplitude of the input current exceeds a threshold value. The output voltage of the solid state linear amplifier does not display a smooth "soft clipping" saturation but, rather, a "hard clipping" saturation.

Figure 7:
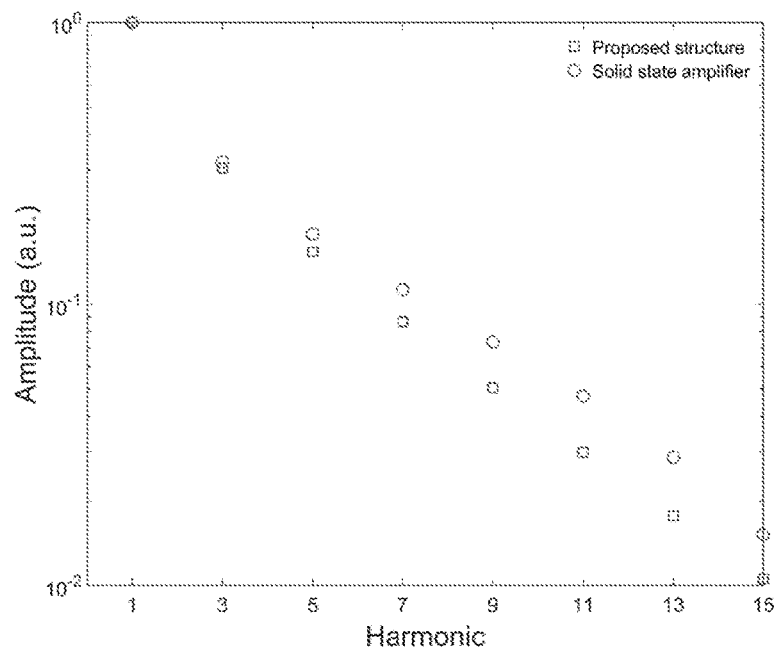
FIG. 7 shows a graph comparing a harmonic spectrum of the voltage output of the signal shaping device obtained for a sinusoidal input current with a harmonic spectrum of an overdriven solid state linear amplifier.

FIG. 7 shows a graph comparing a harmonic spectrum of the voltage output $V_{out}$ of the signal shaping device 100 obtained for a sinusoidal input current 41 with a harmonic spectrum of a solid state linear amplifier with similar saturation threshold and gain as the ones of the signal shaping device 100. The absence of even order harmonics can be attributed to the circuit topology in which the signal shaping device 100 and the solid state amplifier are considered.

Figure 8:
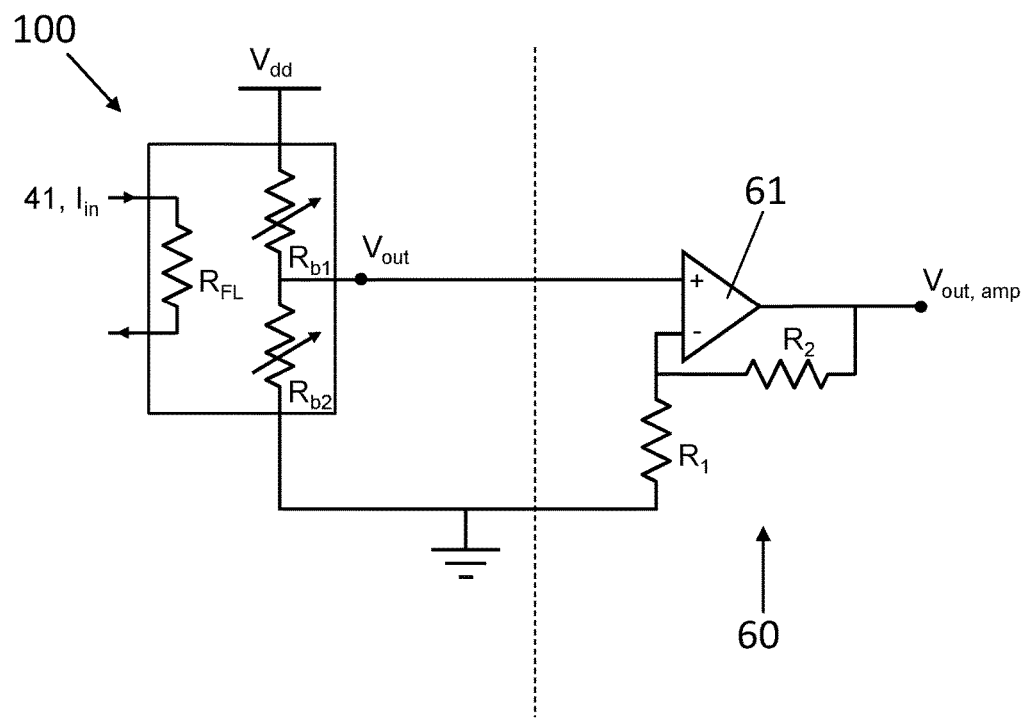
FIG. 8 represents the signal shaping device in combination with a linear solid state amplifier, according to an embodiment.

The signal shaping device 100 is not specifically designed for gain amplification, but rather for signal shaping, and thus may be associated to a linear solid state amplifier in order to amplify the output signal $V_{out}$. FIG. 8 shows the signal shaping device 100 further comprising a linear solid state amplifier 60 electrically connected in series to the output signal $V_{out}$, according to an embodiment. The linear solid state amplifier 60 can comprise a MOSFET or OP Amp based gain stage. The gain of the solid state amplifier 60 should be adapted to ensure that it is always working in its linear regime so that no further alteration of the shape of the output signal $V_{out}$ is induced during this amplification step.

Figure 9:
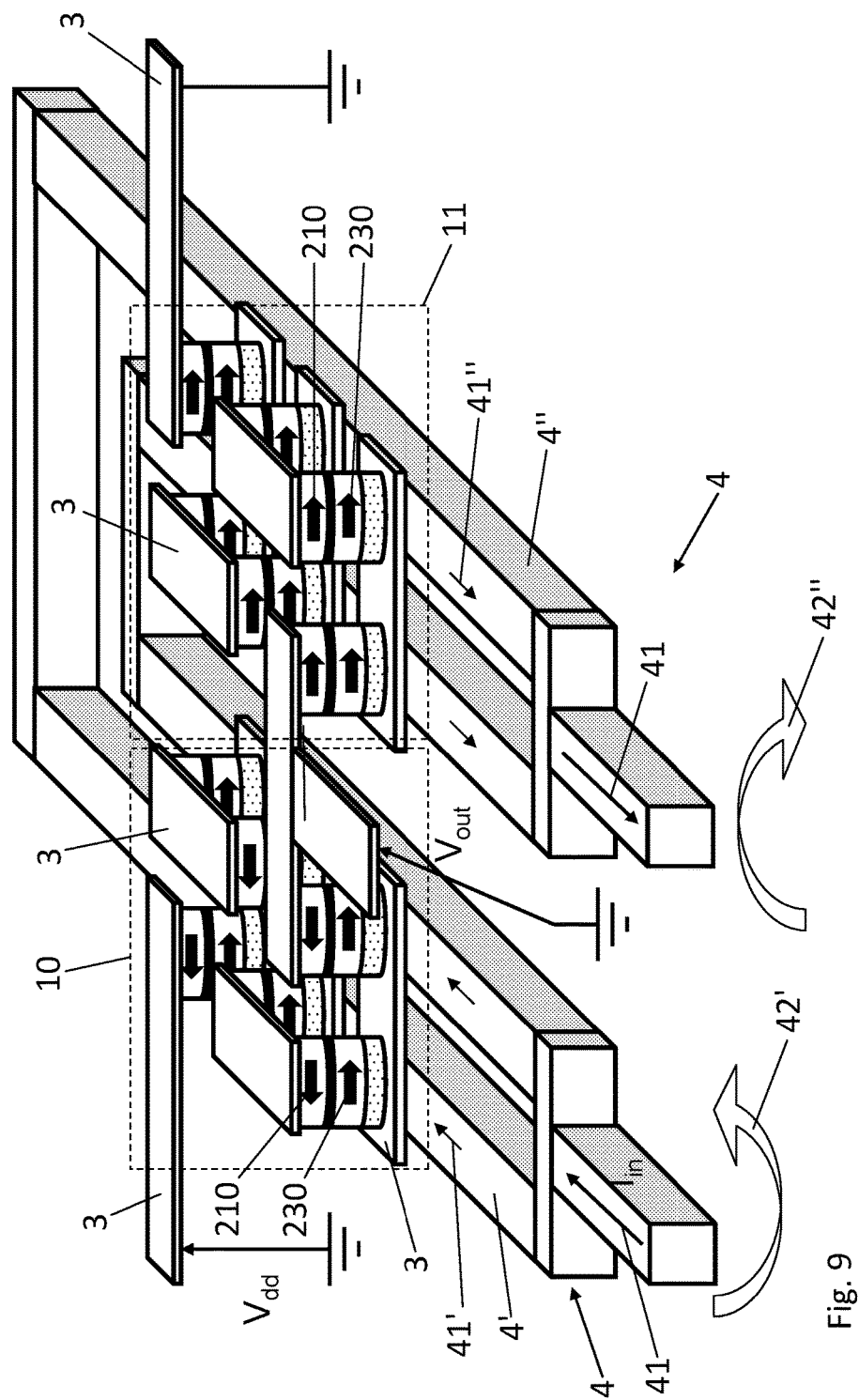
FIG. 9 illustrates a signal shaping circuit where each of first and second magnetoresistive elements comprises a plurality of magnetoresistive cells, according to an embodiment.

In an embodiment illustrated in FIG. 9, each of first and second magnetoresistive element 10, 11 comprises a plurality of magnetoresistive cells 1. In the particular example of FIG. 9, each of the first and second magnetoresistive element 10, 11 comprises a plurality of MRAM cells 1 electrically connected in series via electrically conductive straps 7. In such configuration the first resistance $R_{b1}$ corresponds to an averaged value of the electrical resistances of the plurality of magnetoresistive cells 1 in the first magnetoresistive element 10, and the second resistance $R_{b2}$ corresponds to a mean value of the electrical resistances of the plurality of magnetoresistive cells 1 in the second magnetoresistive element 11. Due to the averaged nature of the first and second resistances $R_{b1}$, $R_{b2}$, the output voltage $V_{out}$ is less sensitive to process induced variabilities of the magnetoresistive cells. The hysteretic behavior of each individual MRAM cell 1 tends to be erased in the average first and second resistances $R_{b1}$, $R_{b2}$.

In the configuration of FIG. 9, the field device is a field line 4 comprising a first portion 4' addressing the plurality of magnetoresistive cells 1 in the first magnetoresistive element 10, and a second portion 4" addressing the plurality of magnetoresistive cells 1 in the second magnetoresistive element 11. When the input current 41 is passed in the field line 4, a first input current portion 41' is passed in the first portion 4' generating a first magnetic field portion 42' that aligns the sense magnetization 210 of each of the plurality of magnetoresistive cells 1 in the first magnetoresistive element 10. A second input current portion 41" is passed in the second portion 4' generating a second magnetic field portion 42" that aligns the sense magnetization 210 of each of the plurality of magnetoresistive cells 1 in the second magnetoresistive element 11.

Due to its U-shape, the first input current portion 41' is passed in the first portion 4' with a polarity opposed to the one of the second input current portion 41". The sense magnetization 210 of each of the plurality of magnetoresistive cells 1 in the first magnetoresistive element 10 is thus aligned in a direction opposed to the one of the sense magnetization 210 of each of the plurality of magnetoresistive cells 1 in the first second magnetoresistive element 11 (see FIG. 9). Since the storage magnetization 230 remains aligned in its programmed direction, passing the input current 41 in the field line 4 varies the first resistance $R_{b1}$ in an opposite fashion to the second resistance $R_{b2}$.

Instead of a U-shape field line 4, the field line 4 can comprise a first portion 4' that is controlled independently from the second portion 4" such as to pass the first input current portion 41' and the second input current portion 41" having opposed polarities.

In FIG. 9, the magnetoresistive cells 1 are illustrated by MRAM cells but could also comprise a magnetoresistive element based on the giant magnetoresistance, a magnetoresistive element providing an anisotropic magnetoresistance effect or a combination of any of these magnetoresistive elements.

It is understood that the present invention is not limited to the exemplary embodiments described above and other examples of implementations are also possible within the scope of the patent claims.

For example, each of first and second magnetoresistive elements 10, 11 can comprise a plurality of magnetoresistive cells 1 (such as in the configuration of FIG. 9) and the field device 4 can comprise an external coil (not shown) or a single field line (such as the one shown in FIG. 1) such as to generate the magnetic field 42 globally across the whole signal shaping device 100. In such case, a differential configuration, or a voltage divider configuration (such as the one of FIGS. 1 and 9) can be obtained by providing the first resistance $R_{b1}$ of the first magnetoresistive element 10 varying in an opposite fashion to the second resistance $R_{b2}$ of the second magnetoresistive element 11. In the case the magnetoresistive cell 1 comprises a MRAM cell, a differential configuration can be achieved by programming the storage magnetization 230 of the magnetoresistive cell 1 comprised in the first magnetoresistive element 10 in a direction opposed than the one of the storage magnetization 230 of the magnetoresistive cell 1 comprised in the second magnetoresistive element 11.

The plurality of magnetoresistive cells 1 comprised in the first and second magnetoresistive element 10, 11 can be arranged in series and/or in parallel. In a configuration not represented, one or several subsets, each subset comprising a plurality of magnetoresistive cells 1 connected in series, can be connected in parallel. Such arrangement can increase the robustness of the signal shaping device 100.

In the case the magnetoresistive cells 1 comprise MRAM cells, the latter can comprise a magnetic tunnel junction having any suitable shape including rectangular, circular and elliptical shapes.

In an alternative configuration not shown, the signal shaping device 100 comprises only one magnetoresistive cell 1, where the output voltage $V_{out}$ corresponds to the response of the varying resistance of the magnetoresistive cell 1 in the magnetic field 42.

REFERENCE NUMBERS AND SYMBOLS 1 magnetoresistive cell, MRAM cell
10 first magnetoresistive element
11 second magnetoresistive element
100 magnetoresistive-based signal shaping device
2 magnetic tunnel junction
21 sense layer
210 sense magnetization
22 tunnel barrier layer
23 reference layer
230 reference magnetization
24 antiferromagnetic layer
3 electrically conductive strap
4 field device, field line
4' first portion of field line
4" second portion of field line
41 input current
41' first input current portion
41" second input current portion
42 external magnetic field
42' first magnetic field portion
42" second magnetic field portion
60 solid state amplifier
61
$R_{avg}$ averaged resistance
$R_{b1}$ first resistance
$R_{b2}$ second resistance
$R_{FL}$ field line resistance
$V_{dd}$ input voltage
$V_{out}$ output voltage

What is claimed is:

1. A magnetoresistive-based signal shaping circuit for audio applications comprising:
   a field emitting device configured for receiving an input current signal from an audio signal source and for generating a magnetic field in accordance with the input current signal,
   a first magnetoresistive element electrically connected in series to a second magnetoresistive element,
   the first magnetoresistive element comprising at least one magnetoresistive cell having a first electrical resistance and the second magnetoresistive element comprising at least one magnetoresistive cell having a second electrical resistance, both first and second electrical resistance varying with the magnetic field;
   the magnetoresistive-based signal shaping device providing an output signal across the second magnetoresistive element when an input voltage is applied across the first and second magnetoresistive element in series;
   the output signal being a function of the electrical resistance and yielding a dynamic range compression effect;
   wherein the magnetoresistive cell comprises magnetic tunnel junction; and
   wherein the first electrical resistance and the second electrical resistance varies with the magnetic field in an opposite fashion.

2. The signal shaping circuit according to claim 1, wherein each of first and second magnetoresistive element comprises a plurality of magnetoresistive cells.

3. The signal shaping circuit according to claim 2, wherein said plurality of magnetoresistive cells are electrically connected in series; and
   wherein the electrical resistance corresponds to a mean value of the electrical resistance of the plurality of magnetoresistive cells.

4. The signal shaping circuit according to claim 2, wherein said plurality of magnetoresistive cells comprises a plurality of subsets, each subset comprising a plurality of magnetoresistive cells connected in series; and
   wherein the subsets are electrically connected in parallel with each other.

5. The signal shaping circuit according to claim 1, wherein the field device is configured to generate a first magnetic field portion having a first direction that varies the electrical resistance of said at least one magnetoresistive cell of the first magnetoresistive element and to generate a second magnetic field portion having a second direction opposed to the first direction and that varies the electrical resistance of said at least one magnetoresistive cell of the second magnetoresistive element.

6. The signal shaping circuit according to claim 1, wherein the field device comprises a field line configured for passing the input current signal.

7. The signal shaping circuit according to claim 6, wherein the field line comprises a first portion for passing a first input current portion having a first polarity and a second portion for passing a second input current portion having a second polarity opposed to the first polarity; and wherein the first portion addresses the first magnetoresistive element and the second portion addresses the second magnetoresistive element.

8. The signal shaping circuit according to claim 1, wherein the magnetic tunnel junction includes a sense layer having a freely alignable sense magnetization; a reference layer having a pinned storage magnetization, and a non-magnetic layer, the electrical resistance varying in accordance with the relative alignment of the sense magnetization with respect to the reference magnetization.

9. The signal shaping circuit according to claim 8, wherein the non-magnetic layer comprises a metal such that the magnetoresistive effect of the magnetoresistive element is based on the giant magnetoresistance.

10. The signal shaping circuit according to claim 8, wherein the non-magnetic layer comprises a thin insulator such that the magnetoresistive effect of the magnetoresistive element is based on the tunnel magnetoresistance.

11. The signal shaping circuit according to claim 8,
wherein the reference layer comprises a synthetic ferrimagnet structure to improve its stability and reduce its magnetostatic coupling with the free layer.

12. The signal shaping circuit according to claim 8,
wherein the magnetic tunnel junction comprises a pinning layer exchange coupling the reference layer such as to pin the reference magnetization at a high threshold temperature.

13. The signal shaping circuit according to claim 12, wherein the pinning layer comprises an antiferromagnet such that the high threshold temperature is in the range of about 200° C. to about 400° C.

14. The signal shaping circuit according to claim 8,
wherein the storage magnetization of said at least one magnetoresistive cell comprised in the first magnetoresistive element is oriented in a direction opposed to the one of the storage magnetization of said at least one magnetoresistive cell comprised in the second magnetoresistive element.

15. The signal shaping circuit according to claim 1,
further comprising a linear solid state amplifier electrically connected in series to the output signal.

16. The signal shaping circuit according to claim 1,
further comprising a linear solid state amplifier electrically connected in series to the field emitting device.

* * * * *